United States Patent [19]

Muething

[11] Patent Number: 4,518,455

[45] Date of Patent: May 21, 1985

[54] CVD PROCESS

[75] Inventor: Kevin A. Muething, Lawrence Township, Mercer County, N.J.

[73] Assignee: AT&T Technologies, Inc., New York, N.Y.

[21] Appl. No.: 414,227

[22] Filed: Sep. 2, 1982

[51] Int. Cl.³ .............................................. C30B 25/14
[52] U.S. Cl. ..................................... 156/613; 427/95; 156/611; 156/DIG. 89
[58] Field of Search ....................... 156/613, DIG. 89; 422/220, 228, 245; 427/95, 248.1, 255.1; 423/349; 118/728

[56] References Cited

U.S. PATENT DOCUMENTS

| 3,578,495 | 5/1971 | Pammer et al. | 156/613 |
| 3,672,948 | 6/1972 | Foehring et al. | 117/106 R |
| 4,288,408 | 9/1981 | Guth et al. | 422/156 |
| 4,341,749 | 7/1982 | Iya et al. | 156/613 |

FOREIGN PATENT DOCUMENTS 63669  5/1977  Japan ........................... 156/DIG. 89

OTHER PUBLICATIONS

Western Elec. Co., Technical Digest No. 11, 7/68, Whitner, 156-663, pp. 5, 6.

Primary Examiner—Hiram H. Bernstein
Attorney, Agent, or Firm—D. J. Kirk; R. B. Levy

[57] ABSTRACT

A chemical vapor deposition epitaxial reactor (10) comprised of a quartz tube (12) with banks of IR lamp proximate the outside surface thereof. A splitter plate (30) located at the inlet of the tube (12) separates reactive gases and nonreactive gases directed longitudinally into the tube. The nonreactive gases, directed along the inside surface of the tube (12), substantially prevents unwanted reactant deposition on the inside surface of the tube (12).

5 Claims, 4 Drawing Figures

CVD PROCESS

TECHNICAL FIELD

The instant invention relates to methods and apparatus for depositing reactants on semiconductor wafers.

BACKGROUND OF THE INVENTION

The use of horizontal chemical vapor deposition (CVD) epitaxial reactors to deposit materials on semiconductor wafers is well known. One such horizontal reactor is comprised of a quartz tube in which a planar graphite susceptor, having a plurality of wafers thereon, is positioned. Banks of infrared (IR) lamps or radio frequency (RF) coils, mounted outside the tube are activated to heat wafers as well as the susceptor which, in turn, also heats the wafers. A flow of silicon-bearing gaseous compounds in a hydrogen ambient are then directed longitudinally into the tube. When the wafers reach a certain temperature, the silicon compounds react on the surface thereof and dissociate resulting in the desired deposited silicon layer thereon. Such a technique is effective and has been used for some time in fabricating semiconductor devices.

However, the deposition process is not selective and, at times silicon material will deposit on the inside surface of the quartz tube. When IR lamps are used the silicon deposited on the wall will absorb the radiant energy therefrom and become hotter, which leads to increased deposition thereon. This positive feedback or runaway situations inhibits efficient deposition on the wafers and can cause the destruction of the tube.

If RF coils are used, the silicon material will also deposit on the inside surface of the tube wall, however, the aforementioned positive feedback situation will not occur as the RF does not couple significantly to the silicon. However, such deposition does increase the frequency of cleaning required to provide an effective CVD process.

One technique used in an attempt to solve this problem is to direct streams of cool air at the outside surface of the tube to stop the silicon deposition on the inside surface of the tube wall. Although such a technique does tend to decrease the undesired deposition, unfortunately, some deposition still occurs with the attendant problems.

Accordingly, there is a need for a technique for substantially eliminating the deposition of silicon on the inside surface of a horizontal chemical vapor deposition reactor during the operation thereof.

SUMMARY OF THE INVENTION

The foregoing problem has been solved by the instant method for depositing reactants on the surface of a semiconductor wafer positioned in an elongated hollow member in a chemical vapor deposition reactor. The method comprises the steps of heating the wafer, directing a first gas stream, containing first and second reactive gases along the hollow member, so that the gases react to cause the deposit of reaction by-product on the surface of the heated wafer; and simultaneously directing a second gas stream, containing the first reactive gas, along the hollow member between the first gas stream and the inner surface of the hollow member upstream of the wafer to reduce the concentration of the second reactive gas along the inner surface of the hollow member to substantially eliminate the deposition of reaction by-product thereon without interfering with the deposition of reaction by-product on the wafer.

DETAILED DESCRIPTION

The instant disclosure sets forth a technique for substantially decreasing the deposition of reactant material on the inner wall surface of a glass tube in an IR heated CVD reactor. However, such description is for the purposes of exposition and not for limitation. For instance, CVD reactors using RF induction heating may advantageously implement the instant technique.

Figure 1:
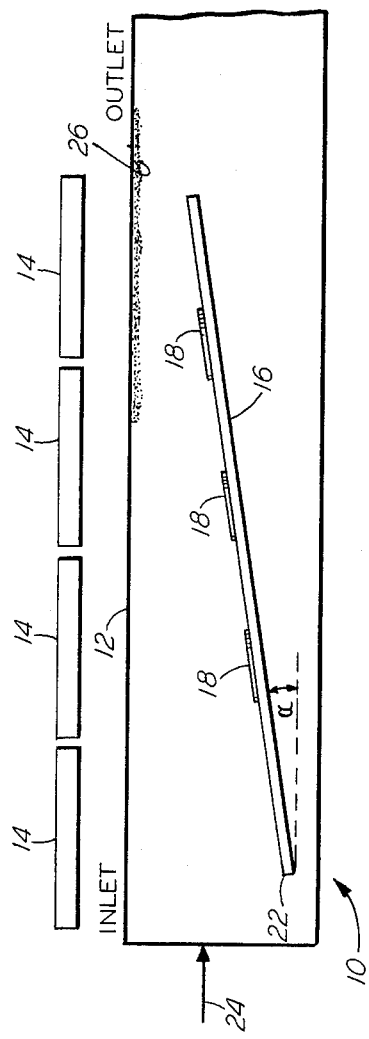
FIG. 1 is a schematic representation of a prior art IR heated horizontal reactor.

FIG. 1 is a schematic representation of a prior art IR heated, horizontal reactor generally designated by the numeral 10. The reactor 10 is comprised of a quartz tube 12, having a rectangular cross section, with banks of IR lamps 14—14 located on the outside top surface of the tube in close, spaced relation thereto. A planar graphite susceptor 16 having a plurality of semiconductor wafers 18—18 thereon is shown positioned inside the tube 12 at a predetermined angle α (approximately 2 to 8 degrees) to the horizontal. The wafers 18—18 are shown slightly upraised from the surface of the susceptor 16 for purposes of exposition, however, in practice, the upper surface of the wafers 18—18 are substantially coplanar with the surface of the susceptor 16.

In operation, the banks of IR lamps 14—14 are activated to heat the wafers 18—18 and the graphite susceptor 16 radiantly which, in turn, conductively heats the wafers to approximately 1,200° C. A flow of reactants comprising silicon bearing gaseous compounds (e.g., $SiHCl_3$ or $SiCl_4$) in a hydrogen ambient are then longitudinally directed into the tube 12 as indicated by the arrow 24 in a velocity range between 200 to 1000 cm/min. The silicon compounds that contact the surface of the heated wafers 18—18 react and dissociate resulting in the desired deposited silicon layer thereon. Undeposited reactants are exhausted through the outlet end of the tube 12. Undesirably, a small portion of silicon 26 deposits on the inside surface of the tube 12 which can result in inefficient operation as well as the destruction of the tube as hereinbefore indicated.

Figure 2:
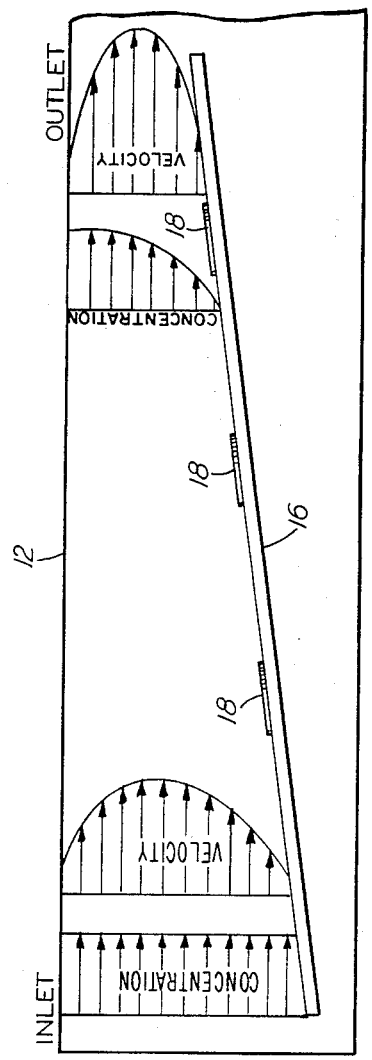
FIG. 2 is a schematic representation of the prior art IR heated horizontal reactor with typical velocity and concentration profiles shown.

FIG. 2 shows the relative concentration of the silicon bearing compounds and the velocity thereof at the inlet and the outlet of the tube 12. The relatively high concentration near the wall surface of the tube 12, proximate the outlet, may account for the silicon 26 deposition shown in FIG. 1.

Figure 3:
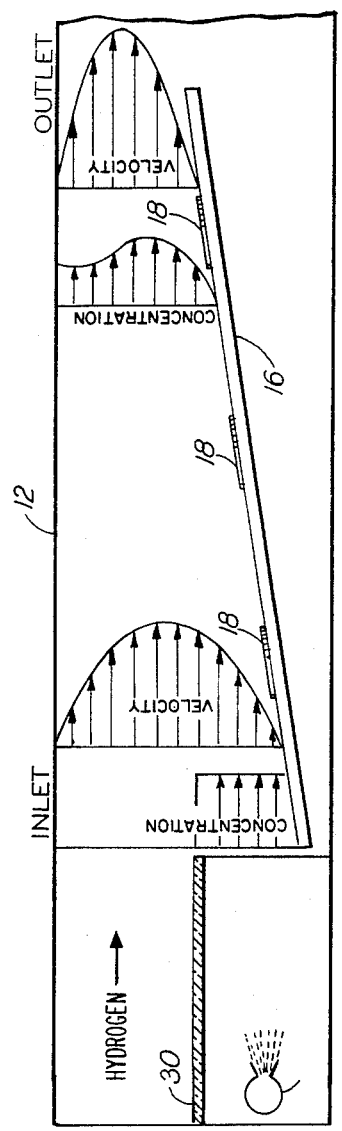
FIG. 3 depicts an IR heated horizontal reactor incorporating the instant inventive concepts.

FIG. 3 shows the addition of a quartz splitter plate 30 proximate the inlet of the tube 12. Silicon containing compounds, carried in hydrogen gas, are directed longitudinally toward the wafers 18—18 on the susceptor 16 from a silicon source injector 32 located beneath the splitter plate 30. Hydrogen gas, containing no silicon compounds, is simultaneously directed longitudinally along the upper half of the tube 12 at the same velocity as the silicon containing compounds in the lower half, resulting in concentrations and velocity profiles shown shortly after passing through the inlet. As the gases move toward the outlet, the silicon compound concentrations and velocity profiles change as shown. It can be seen that the silicon concentration proximate the wall of the tube 12 has been substantially decreased as compared to the outlet concentration shown in FIG. 2. The concentration decrease is on the order of about 2:1 with a noticeable decrease of undesired silicon deposit 26 (see FIG. 1) on the inside surface of the tube 12.

Figure 4:
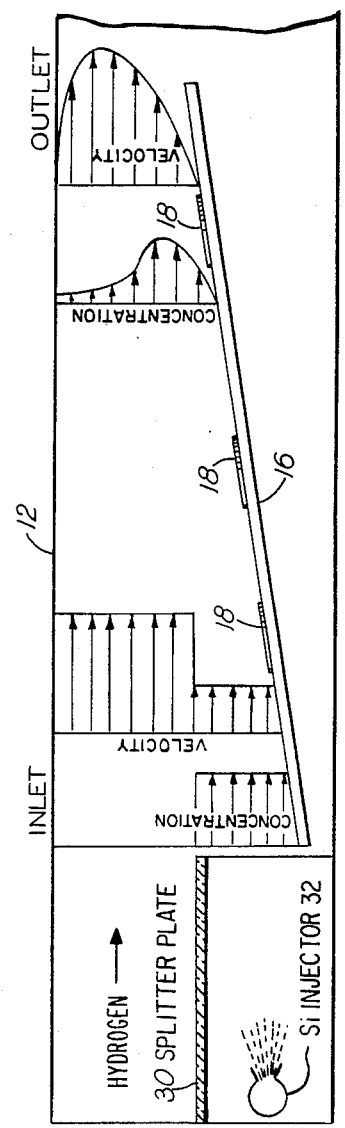
FIG. 4 depicts an alternate embodiment of the instant invention.

A further reduction of the silicon deposit 26 on the inner surface of the tube 12 has been accomplished by making the initial velocity of the reactant-free hydrogen (i.e., above the splitter plate 30) three times greater than that of the reactant-containing gases from the injector 32 at the inlet as shown in FIG. 4. Unexpectedly such a technique reduced the reactant concentration by approximately 90% at the wall of the tube 12 and substantially eliminated the unwanted silicon deposit 26.

Although the mechanism is not fully understood it is believed that the stepped inlet concentration profile, shown in FIGS. 3 and 4, afforded by the splitter plate 30 arrangement requires that the silicon source species diffuse upwards from the lower, high concentration, part of the flow to the wall of the tube 12 before reacting and depositing there. Also, the discontinuous inlet velocity undergoes, because of its viscosity, a redistribution of its momentum; associated with the redistribution is a substantial downward component of velocity which reduces the upward diffusion of the silicon source species.

In a particular embodiment the inlet hydrogen flow was approximately 100 to 400 liters per minute while the inlet trichlorosilane ($SiHCl_3$) flow was a maximum of 60 grams per minute.

The maximum flow of $SiHCl_3$ was $7.3 \times 10^{23}$ atoms/min., while the maximum flow of $H_2$ was $1 \times 10^{25}$ atoms/min. The atom concentration of $SiHCl_3$ in $H_2$ was in the range between 2 to 8 percent.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A method for depositing reactants on the surface of a semiconductor wafer positioned in an elongated hollow member in a chemical vapor deposition reactor, the method comprising the steps of:
   heating the wafer;
   directing a first gas stream containing gaseous reactant compounds in a gaseous ambient containing hydrogen along the hollow member to deposit reactants on the surface of the heated wafer; and
   simultaneously directing a second gas stream comprised of the hydrogen-containing gaseous ambient along the hollow member between the gaseous reactant compounds and the inner surface of the hollow member to substantially eliminate the deposition of reactants thereon without interfering with the deposition of reactants on the wafer.

2. The method as set forth in claim 1 wherein the elongated hollow member is a glass tube and the wafer is radiantly heated from a source located proximate the outside surface of the tube.

3. The method as set forth in claim 1 wherein the velocity of the first gas stream is equal to the velocity of the second gas stream.

4. The method as set forth in claim 1 wherein the velocity of the second gas stream is greater than the velocity of the first gas stream.

5. A method for depositing reactants on the surface of a semiconductor wafer positioned in an elongated hollow member in a chemical vapor deposition reactor, the method comprising the steps of:
   heating the wafer;
   directing a first gas stream containing gaseous reactant compounds in a gaseous ambient containing hydrogen along the hollow member to deposit reactants on the surface of the heated wafer; and
   simultaneously directing a second gas stream comprised of the hydrogen-containing gaseous ambient along the hollow member between the gaseous reactant compounds and the inner surface of the hollow member at a velocity three times that of said first gas stream thereby decreasing the concentration of the gaseous reactant compounds along the inner surface of the hollow member to substantially eliminate reactant deposition thereon without interfering with the reactant deposition on the wafer.

* * * * *